United States Patent
Ochi

(10) Patent No.: US 6,583,665 B2
(45) Date of Patent: Jun. 24, 2003

(54) DIFFERENTIAL AMPLIFIER HAVING ACTIVE LOAD DEVICE SCALING

(75) Inventor: Sam Ochi, Saratoga, CA (US)

(73) Assignee: IXYS Corporation, Santa Clara, CA (US)

( * ) Notice: Subject to any disclaimer, the term of this patent is extended or adjusted under 35 U.S.C. 154(b) by 0 days.

(21) Appl. No.: 09/915,227

(22) Filed: Jul. 23, 2001

(65) Prior Publication Data

US 2002/0079966 A1 Jun. 27, 2002

Related U.S. Application Data

(60) Provisional application No. 60/220,069, filed on Jul. 21, 2000.

(51) Int. Cl.$^7$ ................................................ H03F 3/45
(52) U.S. Cl. ....................................... 330/253; 330/261
(58) Field of Search ................................. 330/253, 261

(56) References Cited

U.S. PATENT DOCUMENTS

| | | | | |
|---|---|---|---|---|
| 4,634,993 A | * | 1/1987 | Koen | 330/253 |
| 4,987,379 A | * | 1/1991 | Hughes | 330/253 |
| 5,157,349 A | * | 10/1992 | Babanezhad | 330/253 |
| 5,283,535 A | * | 2/1994 | Sevenhans et al. | 330/253 |
| 5,515,003 A | * | 5/1996 | Kimura | 330/253 |
| 6,028,480 A | * | 2/2000 | Seevinck et al. | 330/253 |
| 6,121,836 A | * | 9/2000 | Vallencourt | 330/253 |

* cited by examiner

Primary Examiner—Don Le
Assistant Examiner—Lam T. Mai
(74) Attorney, Agent, or Firm—Townsend and Townsend and Crew LLP

(57) ABSTRACT

In a CMOS differential amplifier, first and second input transistors are matched in size to each other, and first and second load transistors are matched in size to each other. The first input transistor, a source follower transistor, and the first load transistor form one current branch of the differential structure while the second input transistor and second load transistor form another current branch of the differential structure. A first current source supplies current to both branches of the differential structure. An output transistor of the first conductivity type has its gate tied to the drain of the second load transistor. A second current source is coupled to the drain of the output transistor. A first source follower bias transistor of the first conductivity type is diode connected, and its drain is coupled to the source of a second source follower bias transistor of the first conductivity type that is also diode connected. The drain of the second source follower bias transistor is coupled to the gate of the source follower transistor. A third current source is coupled to the drain of the second source follower bias transistor. The ratio of the current from the third current source to the width-to-length ratio of the first source follower bias transistor is equal to a ratio of a current from the second current source divided by a width-to-length ratio of the output transistor; and a ratio of a current from the third current source to the width-to-length ratio of the second source follower bias transistor is equal to a ratio of half of a current from the first current source to the width-to-length ratio of the source follower transistor.

10 Claims, 2 Drawing Sheets

_US 6,583,665 B2_

DIFFERENTIAL AMPLIFIER HAVING ACTIVE LOAD DEVICE SCALING

CROSS-REFERENCES TO RELATED APPLICATION

This application claims priority for U.S. Provisional Application No. 60/220,069, entitled "Active Load Device Scaling Invention", filed on Jul. 21, 2000, which is herein incorporated by reference in its entirety for all purposes.

BACKGROUND OF THE INVENTION

1. Field of the Invention

The present invention is related to the field of CMOS circuits, and specifically to the field of CMOS differential amplifiers.

2. Discussion of the Related Art

FIG. 1 shows a conventional differential amplifier with active load and a second stage output. The conventional differential amplifier illustrated in FIG. 1 is designed for low offset voltage and noise performance. The matched p-channel device input transistors M1 and M2 with W/L ratios of X drive an active load, n-channel load transistors M3 and M4, whose W/L ratios are X/4.

The second stage device is driven with a current source, I2, whose value is scaled at 10 times that of I1. As such, M5 is sized at 2.5X such that the voltages across resistances Ro1 and Ro2 equal.

As the drain of M5 will be the output of this two-stage amplifier, the 2.5X scaling significantly compromises its output drive and overall gain performance. Moreover, if the conventional amplifier depicted in FIG. 1 is to be used as an operational amplifier in which the gains of input transistors M1 and M2 must be kept low for overall compensation purposes, then the numerical value of X may need to be selected as low as unity or perhaps even lower than unity depending on the desired Vout frequency and slew rate performance characteristics. In this case, if the input transistors are relatively small, then the output transistor will also be relatively small, thereby reducing the output drive strength of the differential amplifier.

As is apparent from the above discussion, a need exists for a differential amplifier having increased drive and gain performance.

SUMMARY OF THE INVENTION

According to the present invention, a CMOS differential amplifier includes three additional devices and an additional current source over and above conventional amplifiers. The three additional devices and current source are sized relative to one another, and relative to the sizes of the various other elements in the differential amplifier so that the size of the output device is not dependent upon the size of the input and load devices, thereby permitting increased drive and gain performance while still allowing the use of small input devices.

According to the present invention, a CMOS differential amplifier includes first and second input transistors of the second conductivity type, first and second load transistors of a first conductivity type, and a source follower transistor of the first conductivity type that is connected in series between the first input transistor and the first load transistor. For example, the first conductivity type is N-channel MOS type device, and the second conductivity type is P-channel MOS type device.

The first and second input transistors are matched in size to each other, and the first and second load transistors are matched in size to each other. The first input transistor, source follower transistor, and first load transistor form one current branch of the differential structure while the second input transistor and second load transistor form another current branch of the differential structure. A first current source supplies current to both branches of the differential structure.

An output transistor of the first conductivity type has its gate tied to the drain of the second load transistor. A second current source is coupled to the drain of the output transistor.

A first source follower bias transistor of the first conductivity type is diode connected, and its drain is coupled to the source of a second source follower bias transistor of the first conductivity type that is also diode connected. The drain of the second source follower bias transistor is coupled to the gate of the source follower transistor. A third current source is coupled to the drain of the second source follower bias transistor.

According to another aspect of the present invention, the ratio of the current from the third current source to the width-to-length ratio of the first source follower bias transistor is equal to a ratio of a current from the second current source divided by a width-to-length ratio of the output transistor. According to another aspect of the present invention, a ratio of a current from the third current source to the width-to-length ratio of the second source follower bias transistor is equal to a ratio of half of a current from the first current source to the width-to-length ratio of the source follower transistor.

These and other features, aspects, and advantages of the present invention will be apparent from the Figures read in conjunction with the Detailed Description of the Invention.

The Figures are more thoroughly explained in the Detailed Description of the Invention.

DETAILED DESCRIPTION OF THE INVENTION

Figure 1:
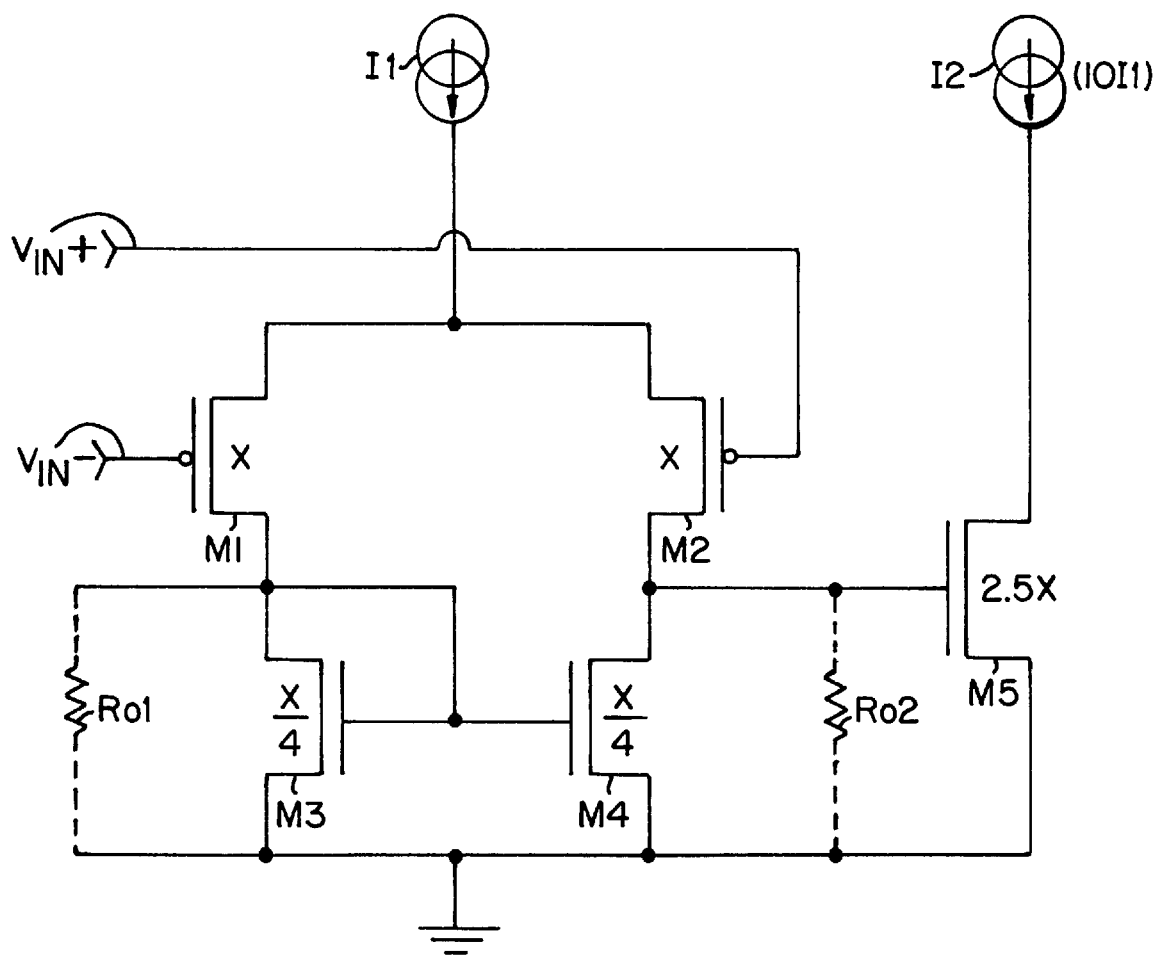
FIG. 1 illustrates a conventional differential amplifier with active load and matched output.

In the conventional differential amplifier illustrated in FIG. 1, the minimum input offset voltage with respect to Vin+-Vin- is achieved when the voltages across resistances Ro1 and Ro2 are equal. Since the W/L ratio value is proportional to the gain of the device, the gains of M1 and M2 are designed to dominate M3 and M4 for optimum noise and offset performance.

Figure 2:
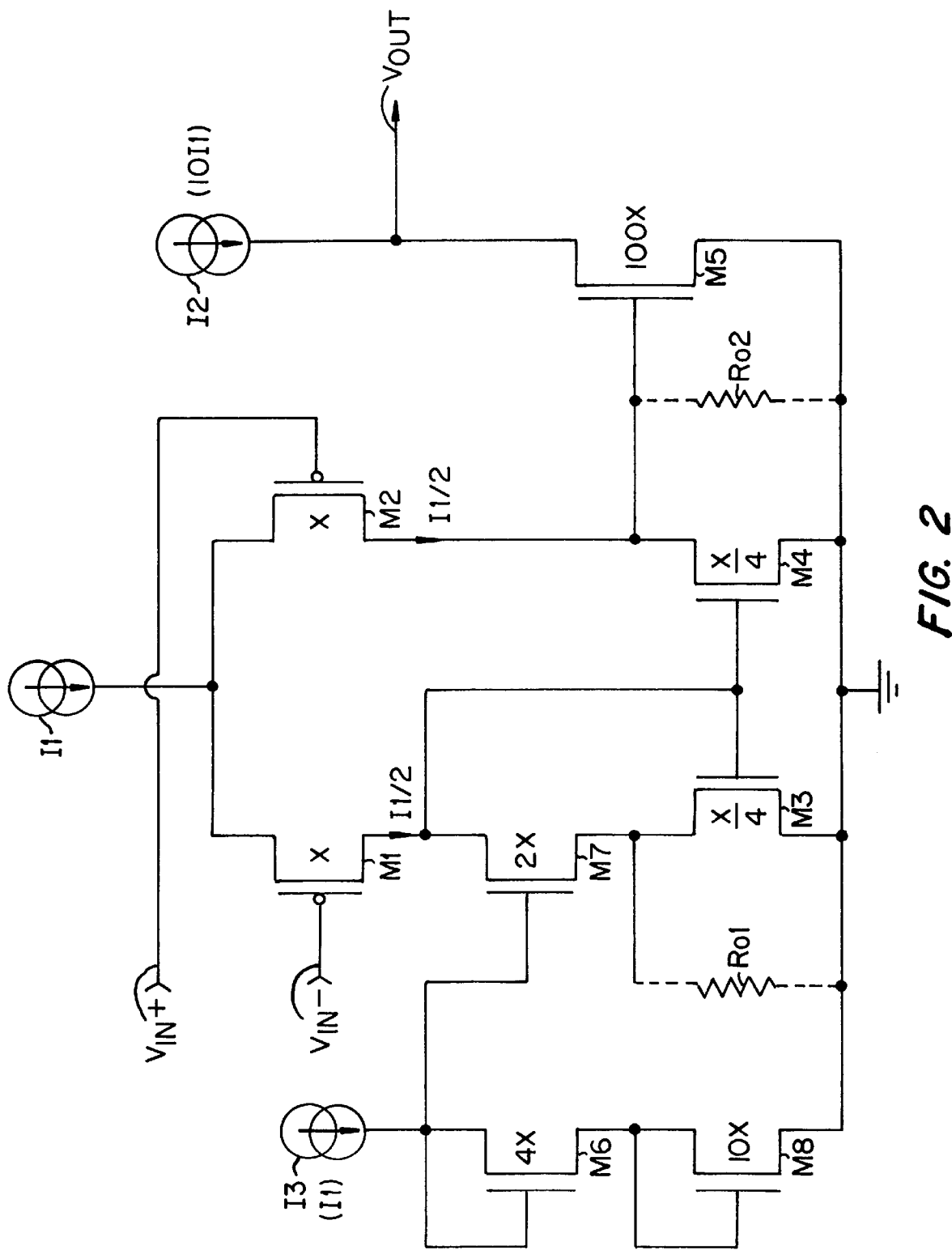
FIG. 2 shows a differential amplifier with active load and matched output in accordance with the present invention.

Resistance Ro1 is a parallel combination of the output impedance effects seen by the intersection of the drain of load transistor M3 and the drain of input transistor M1, and resistance Ro2 is a parallel combination of the output impedance effects seen by the intersection of the drain of input transistor M2 and the drain of load transistor M4. In other words, resistances Ro1 and Ro2 are parasitic resistances that model the facts that the actual transistors not ideal MOS devices. For an ideal MOS device in the saturation region, the drain voltage is independent of the drain-to-source voltage. However, what is observed in real devices is that there is a very slight drain current dependency upon the drain-to-source voltage, which is modeled by resistances Ro1 and Ro2. The various transistors illustrated in FIGS. 1 and 2 are therefore assumed to be ideal transistors, with the non-idealities thereof modeled by parasitic resistances Ro1 and Ro2. The value in ohms of the parasitic resistances Ro1 and Ro2 are relatively high in proportion to the equivalent resistances through the input transistors M1 and M2 and through the load transistors M3 and M4 when those transistors are conducting. To a first order approximation, the resistances Ro1 and Ro2 are typically the same, having only slight variation to one another.

One of the important characteristics of an amplifier is the output voltage as a function of some input voltage. In the context of the amplifiers shown in FIGS. 1 and 2, if the input voltage Vin+-Vin- is zero (because Vin+ and Vin- are the same voltage), then the output voltage Vout should be at some nominal voltage such as one-half of the power supply voltage, or in other words "mid-scale". So if the power supply is ten volts, then the mid-scale output voltage is five volts. If the gate voltages at input transistors M1 and M2 are the same, then the drain currents through M1 and M2 should be identical as well; as long as the voltage drops across load transistors M3 and M4 are identical. If the drain-to-source voltages for load transistors M3 and M4 are the same, then the drain currents through input transistors M1 and M2 will be the same. To make the drain voltages at load transistors M3 and M4 the same, the size of output transistor MS is adjusted such that when the drain-to-source potential of load transistor M4 is the same as the drain-to-source potential of load transistor M3, the current through the output transistor M5 will be at mid-scale.

In both FIGS. 1 and 2, the load resistance to ground through Vout (not shown) is assumed to be large in comparison to the resistance through output transistor M5.

FIG. 2 includes three additional devices, M6, M7, and M8, along with a current source 13 beyond those shown in the conventional differential amplifier shown in FIG. 1. Source follower transistor M7, first source follower bias transistor M8, and second source follower bias transistor M6, and third current source 13 allow the size of the output transistor M5 to be decoupled from the relative sizes of the input and load transistors M1 through M4. The input and load devices M1 through M4 are still scaled to optimize the input AC and DC performance. However, output transistor M5 according to the present invention is scaled at a much greater level according to the present invention than the output transistor M5 in the conventional amplifier shown in FIG. 1. For example, the output transistor M5 according to the present invention in FIG. 2 is shown at an exemplary level of 100X to improve output and overall gain characteristics. The third current source 13, whose value is illustrated as being equal to I1 biases the diode connected first source follower bias transistor M8, shown at an exemplary 10X level to a voltage $V_{GSM8}$, although there is no requirement according to the present invention that I3 and I1 be equal. The value of the second current source I2 is set at an exemplary value that is ten times the value of the first current source I1. (Thus, I2=10I1 and I3=I1, for the sake of example.) When the output transistor M5 is operating in the saturated region of operation, $V_{DSM5}>(V_{GSM5}-Vtn)$. The size or strength of a transistor is measured by its channel width-to-length ratio (W/L), and is illustrated in FIGS. 1 and 2 as a multiple of X shown the channel of the transistors.

The ratio of the current from the third current source I3 divided by the size of the first source follower bias transistor M8 is I1/10X. The ratio of the current from the second current source divided by the size of the output transistor M5 is 10*I1/100X, which reduces to I1/10X. Because the current-to-size ratio for the first source follower bias transistor M8 is the same as the current-to-size ratio for the output transistor M5, their respective source current densities of the first source follower bias transistor M8 and output transistor M5 are equal, resulting in $V_{GSM8}=\sim V_{GSM5}$. The diode connected second source follower bias transistor M6 is used to provide the gate voltage for a source follower transistor M7. According to the present invention, both the second source follower bias transistor M6 and the source follower transistor M7 are scaled to maintain equal source current densities, so that the second source follower transistor M6 size is W/L=4X with I1 flowing through its drain, and source follower transistor M7 is scaled at 2X with ½ I1 flowing through its drain. This fact keeps $V_{GSM6}=\sim V_{GSM7}$. By inspection, $V_{DSM3}=\sim V_{DSM4}=\sim V_{GSM5}$, and results in keeping the current mirror devices load transistors M3 and M4 in balance regardless of the scaling of output transistor M5.

An objective of the present invention is to have a large output transistor M5, which is capable of faster switching of a large output node because it is capable of carrying a higher current. Having a large output transistor M5 provides a much lower output impedance for the transistor.

If the size of output transistor M5 were increased in the conventional amplifier shown in FIG. 1 up to 100X, for example, without changing the sizes of the other devices, then the conventional amplifier would be imbalanced. In order to maintain good offset performance and noise performance, it is desirable to keep the width/length ratios of the load transistors M3 and M4 relatively small. However, in the conventional amplifier shown in FIG. 1, the size of the output transistor M5 can only be scaled up so that its mid-scale current-to-size ratio is the same as the mid-scale current-to-size ratio of load transistors M3 and M4. In FIG. 1, the mid-scale current-to-size ratio of output transistor M5 is 5*I1/2.5X, which is 2I1X, and the mid-scale current-to-size ratio of both of load transistors M3 and M4 is 0.5I1/0.25X, which is also 2I1X.

However, in FIG. 2 according to the present invention, the scaling of output transistor M5 is independent of the scaling of the input transistors M1 and M2 and the load devices M3 and M4. One of the goals of designing an input stage of a differential amplifier is to make the transconductance of the input stage much higher than the transconductance of the load devices. In the conventional amplifier, the transconductance of the input stage is the transconductance of M1 or M2, and the transconductance of the load stage is the transconductance of M3 or M4. By making the transconductance of the input devices as high as possible relative to the transconductance of the load devices, offset voltage performance is optimized. In an amplifier, the lowest possible offset voltage is desired, and it is also desirable to have the best possible noise performance.

In the context of FIG. 2, the load transconductance is proportional to X/4, which is the width divided by length ratio of load transistors M3 and M4, while the load transconductance is approximately proportional to X/2, which is the width divided by length ratio of input transistors M1 and M2 divided by two, because the strength of a p-channel device is approximately half that of a similarly sized n-channel device. Thus, the ratio of the input transconductance to load transconductance is approximately two (0.5X/0.25X) in the differential amplifier of FIG. 2.

In the differential amplifier illustrated in FIG. 1, it is necessary to have the same current density in the load transistors M3 and M4 as in the output transistor M5.

Because the current through output transistor M5 is ten times the current through load transistor M4, output transistor M5 is sized at 2.5X to be ten times the size of each of the load transistors M3 and M4, which are each 0.25X.

According to the present invention, it is necessary to make the drain-to-source voltage of load transistor M3 the same as the drain-to-source voltage of load transistor M4 when Vin+-Vin- is zero, so that the circuit is balanced. However, the drain voltage of load transistor M4 controls the drain current of the output transistor M5, assuming that Vout is at mid-scale when Vin+-Vin- is zero. It is desirable to make the drain voltage of load transistor M3 the same as the drain voltage of load transistor M4. Whereas in the conventional circuit shown in FIG. 1 the drain voltage of load transistor M3 and the gate voltages of load transistors M3 and M4 are equal, according to the present invention, the drain voltage of load transistor M3 is lower than the gate voltages of both of load transistors M3 and M4, thereby cranking up the drive current through load transistors M3 and M4.

According to the present invention, the second source follower bias transistor M6 has the same current to size ratio as the current to size ratio for source follower transistor M7. The source potential for source follower transistor M7 is the same potential as the gate to source potential of the first source follower bias transistor M8, thus the drain to source potential for load transistor M3 is the same as the drain to source potential for the first source follower bias transistor M8.

According to the present invention, the sizing of output transistor M5 must be scaled so as to have the same current density as the first source follower bias transistor M8. In the case illustrated in FIG. 2, because the second current source I2 (which is set to ten times I1 in the example illustrated in FIG. 2) that feeds the output transistor M5 is ten times as large as the third current source I3 (which set to be equal to I1 in the example of FIG. 2) that feeds the first source follower bias transistor M8, then the output transistor M5 is scaled so as to be ten times the size of the first source follower bias transistor M8, as demonstrated by output transistor M5 being sized at 100X while first source follower bias transistor M8 is sized at 10X.

While the present invention has been described with reference to its exemplary embodiment, that embodiment is offered by way of example, not by way of limitation. Those of ordinary skill in the art will be enabled by this disclosure to add to or modify the embodiments of the present invention in various ways. For example, while the embodiment shown in FIG. 2 shows the input devices as being p-channel devices and the other devices as n-channel devices, this is not required according to the present invention. For example, by reversing the ground and power supply voltages, and by reversing the directions of the current sources, the input devices M1 and M2 can be formed of n-channel devices while the remaining devices M3 and M8 can be formed of p-channel devices. As another example, the nominal sizes of the currents and transistors shown in FIG. 2 are only one example of the sizes that can be implemented according to the present invention. Accordingly, those additions and modifications are deemed to lie within the spirit and scope of the present invention, as delineated by the appended claims.

What is claimed is:

1. A CMOS differential amplifier, comprising:
    a first input transistor of a second conductivity type having a gate, a source, and a drain;
    a second input transistor of the second conductivity type having a gate, a source, and a drain;
    a first load transistor of a first conductivity type having a gate, a source, and a drain;
    a second load transistor of the first conductivity type having a gate, a source, and a drain; and
    a source follower transistor of the first conductivity type having a gate, a source, and a drain;
    wherein the source of the first input transistor is coupled to the source of the second input transistor;
    wherein the drain of the source follower transistor is coupled to the drain of the first input transistor;
    wherein the source of the source follower transistor is coupled to the drain of the first load transistor;
    wherein the drain of the second input transistor is coupled to the drain of the second load transistor; and
    wherein the drain of the source follower transistor is coupled to the gate of the first load transistor and to the gate of the second load transistor.

2. A CMOS differential amplifier as in claim 1,
    wherein a width-to-length ratio of the first input transistor is equal to a width-to-length ratio of the second input transistor; and
    wherein a width-to-length ratio of the first load transistor is equal to a width-to-length ratio of the second load transistor.

3. A CMOS differential amplifier as in claim 2,
    wherein the first conductivity type is n-channel; and
    wherein the second conductivity type is p-channel.

4. A CMOS differential amplifier as in claim 3, further comprising:
    a first current source coupled to the source first input transistor and to the source of the second transistor.

5. A CMOS differential amplifier as in claim 2, further comprising:
    an output transistor of the first conductivity type having a gate, a source, and a drain;
    wherein the gate of the output transistor is coupled to the drain of the second load transistor.

6. A CMOS differential amplifier as in claim 5, further comprising:
    a second current source coupled to the drain of the output transistor.

7. A CMOS differential amplifier as in claim 6, further comprising:
    a first source follower bias transistor of the first conductivity type having a gate, a source, and a drain; and
    a second source follower bias transistor of the first conductivity type having a gate, a source, and a drain;
    wherein the drain of the second source follower bias transistor is coupled to the gate of the second source follower bias transistor and to the gate of the source follower transistor;
    wherein the drain of the first source follower bias transistor is coupled to the gate of the first source follower bias transistor and to the source of the second source follower bias transistor.

8. A CMOS differential amplifier as in claim 7, further comprising:
    a third current source coupled to the drain of the second source follower bias transistor.

9. A CMOS differential amplifier as in claim 8,
    wherein a ratio of a current from the third current source to the width-to-length ratio of the first source follower bias transistor is equal to a ratio of a current from the second current source divided by a width-to-length ratio of the output transistor.

10. A CMOS differential amplifier as in claim 9, wherein a ratio of a current from the third current source to the width-to-length ratio of the second source follower bias transistor is equal to a ratio of half of a current from the first current source to the width-to-length ratio of the source follower transistor.

* * * * *